United States Patent
Kameshima

(10) Patent No.: US 11,420,431 B2
(45) Date of Patent: Aug. 23, 2022

(54) ADHERING JIG AND ADHERING METHOD

(71) Applicant: NICHIA CORPORATION, Anan (JP)

(72) Inventor: Yumiko Kameshima, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 17/101,589

(22) Filed: Nov. 23, 2020

(65) Prior Publication Data

US 2021/0154987 A1     May 27, 2021

(30) Foreign Application Priority Data

Nov. 27, 2019    (JP) .............................. JP2019-214728

(51) Int. Cl.
    *B32B 37/00*        (2006.01)
    *H05K 3/00*        (2006.01)
    *B32B 37/10*        (2006.01)
    *H05K 1/02*        (2006.01)

(52) U.S. Cl.
CPC ...... *B32B 37/0046* (2013.01); *B32B 37/1018* (2013.01); *H05K 3/0058* (2013.01); *B32B 2457/08* (2013.01); *H05K 1/028* (2013.01); *H05K 2203/0169* (2013.01)

(58) Field of Classification Search
CPC ............ B32B 37/0046; B32B 37/1018; B32B 2457/08; H05K 3/0058; H05K 2203/0169; H05K 1/028
See application file for complete search history.

(56) References Cited

U.S. PATENT DOCUMENTS

| | | | | |
|---|---|---|---|---|
| 4,764,327 A | * | 8/1988 | Nozaki | ................... B29C 33/40 264/225 |
| 2002/0083961 A1 | * | 7/2002 | Tsuga | ................... B08B 7/0057 134/1.3 |
| 2004/0027811 A1 | * | 2/2004 | Onitsuka | ................. H01L 24/97 361/749 |

(Continued)

FOREIGN PATENT DOCUMENTS

| | | | |
|---|---|---|---|
| CN | 206181571 U | * | 5/2017 |
| JP | H 08-324528 A | | 12/1996 |

(Continued)

OTHER PUBLICATIONS

CN 206181571U machine translation of description (EPO and Google) (Year: 2021).*

*Primary Examiner* — Cynthia L Schaller
(74) *Attorney, Agent, or Firm* — Squire Patton Boggs (US) LLP

(57) ABSTRACT

An adhering jig includes a mounting plate having an upper surface, and a plurality of aligning parts incorporated in the mounting plate. A plurality of first holes are formed in the upper surface, and a plurality of first pins are engaged in the plurality of first holes, each having a base end and an upper end, and configured to be movable in a direction normal to the upper surface. A plurality of first adjusting members are located inward with respect to the upper surface. The plurality of first adjusting members are configured to support the plurality of first pins and to adjust movements thereof. The plurality of first adjusting members are, when the plurality of first pins are pressed in the first holes, configured to exert opposite force to the force applied through the plurality of first pins.

24 Claims, 14 Drawing Sheets

(56) References Cited

U.S. PATENT DOCUMENTS

2004/0164396 A1    8/2004   Hashimoto
2017/0373234 A1   12/2017   Nagae

FOREIGN PATENT DOCUMENTS

| JP | 2005-210003 A | 8/2005 |
| --- | --- | --- |
| JP | 2007-243207 A | 9/2007 |
| JP | 2010-064419 A | 3/2010 |
| JP | 2013-071737 A | 4/2013 |
| JP | 2018-006362 A | 1/2018 |
| JP | 2019-133962 A | 8/2019 |
| WO | WO 2009/034819 A1 | 3/2009 |
| WO | WO 2011/036913 A1 | 3/2011 |
| WO | WO 2012/108164 A1 | 8/2012 |
| WO | WO 2015/037135 A1 | 3/2015 |

* cited by examiner

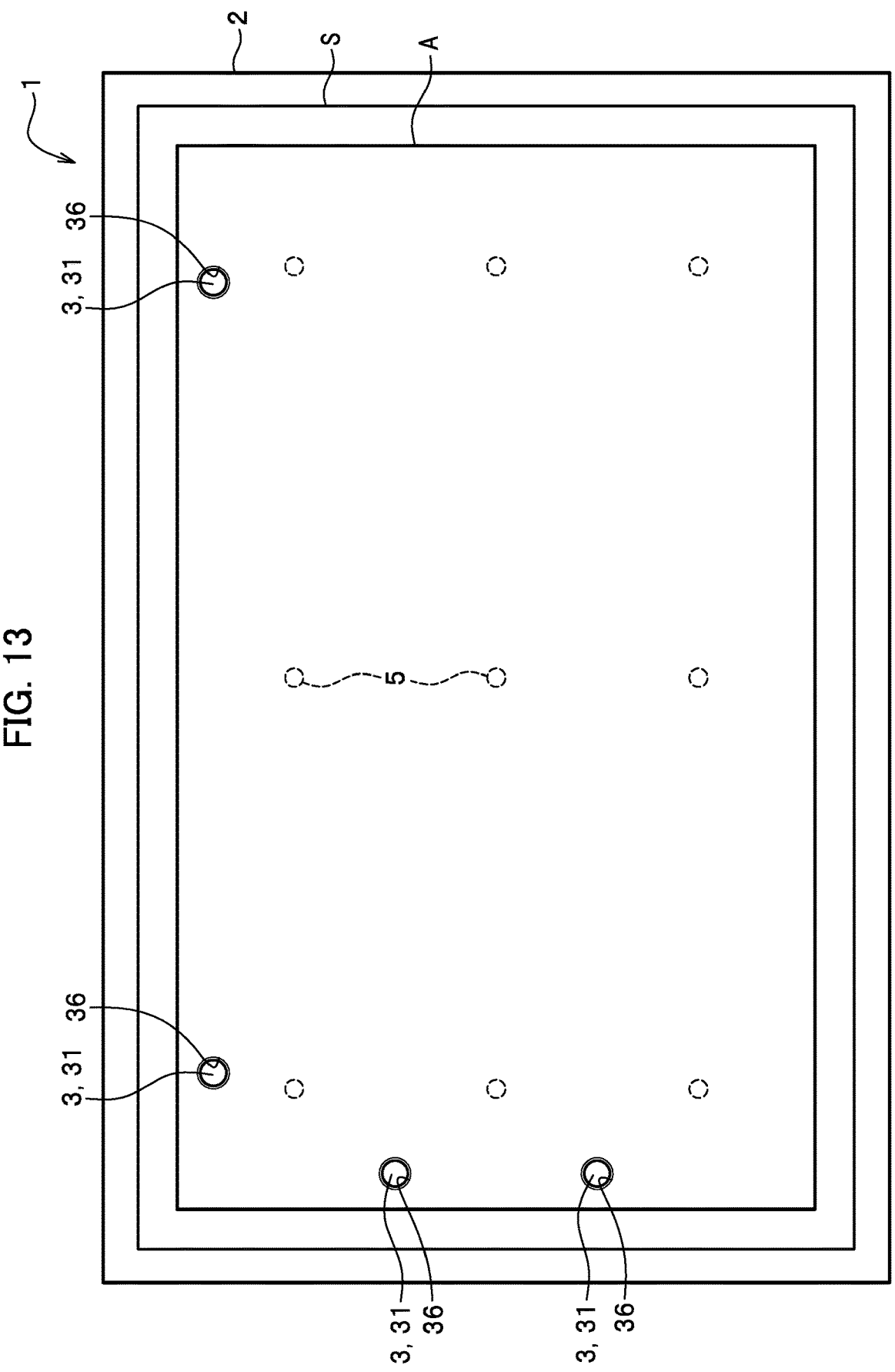

ADHERING JIG AND ADHERING METHOD

CROSS-REFERENCE TO RELATED PATENT APPLICATION

The present application claims priority under 35 U. S. C. § 119 to Japanese Patent Application No. 2019-214728, filed Nov. 27, 2019. The contents of Japanese Patent Application No 2019-214728 are incorporated herein by reference in their entirety.

BACKGROUND

Technical Field

The present disclosure relates to an adhering jig and an adhering method.

Description of Related Art

International Publication No. WO 2011/036913 describes a technique of adhesively securing a printed circuit substrate such as a flexible printed circuit (FPC) substrate, which is an object to be adhered, with a composite sheet material, which is an adhesive member, while aligning the flexible printed circuits (FPC) substrate to the composite sheet material. More specifically, the FPC substrate is aligned by matching through-holes formed in the FPC substrate with through-holes formed in a substrate conveying jig, and inserting pins into respective matched through-holes. In International Publication No. WO 2011/036913, the FPC substrate is adhesively secured in the aligned position by the adhesive power of at a surface of a vulcanized fluororubber layer of the composite sheet.

SUMMARY

It is an object of certain embodiments of the present disclosure to provide an adhering jig and an adhering method in which voids are hardly formed when the adhesive member is adhered to a target (hereinafter may be referred to as "adhesion target").

An adhering jig according to certain embodiments of the present disclosure includes: a mounting plate having an upper surface; a plurality of aligning parts incorporated in the mounting plate; a plurality of first holes formed in the upper surface of the mounting plate; a plurality of first pins engaged in the plurality of first holes, the plurality of first pins respectively having a base end and an upper end, configured to be movable in a direction normal to the upper surface of the mounting plate; and a plurality of first adjusting members located inward with respect to the upper surface of the mounting plate, the plurality of first adjusting members being configured to support the plurality of first pins and to adjust movements of the plurality of first pins. The plurality of first adjusting members are, when the plurality of first pins are pressed in the first holes, configured to exert opposite force to the force applied through the plurality of first pins.

An adhering method according to certain embodiments of the present disclosure is a method of adhering an adhesive member to an adhesion target using the adhering jig described above. The method includes: mounting the adhesion target on the mounting plate, the mounting including: engaging the plurality of first through-holes formed in the adhesion target with the plurality of first pins affixed on the plurality of first adjusting members that are, when the plurality of first pins are pressed in the first holes, configured to support the plurality of first pins through exerting a force opposite to the force applied through the plurality of first pins, and mounting the adhesion target on the mounting plate; supporting the adhesive member on the plurality of first pins, spaced apart from the adhesion target, while abutting the adhesive member to the aligning parts; and adhering the adhesive member and the adhesion target, the adhering including, causing the plurality of first pins to move downward, normal to the upper surface of the mounting plate such that at least a portion of the first pins are lowered in the first holes, while pressing the adhesive member against the adhesion target and to thereby adhere the adhesive member to the adhesion target.

With the adhering jig and the adhering method according to certain embodiments of the present disclosure, voids are hardly formed when the adhesive member is adhered to an adhesion target.

BRIEF DESCRIPTION OF THE DRAWINGS

FIG. 13 is a plan view illustrating another variant example according to the present embodiment.

DETAILED DESCRIPTION OF THE EMBODIMENTS

Figure 1:
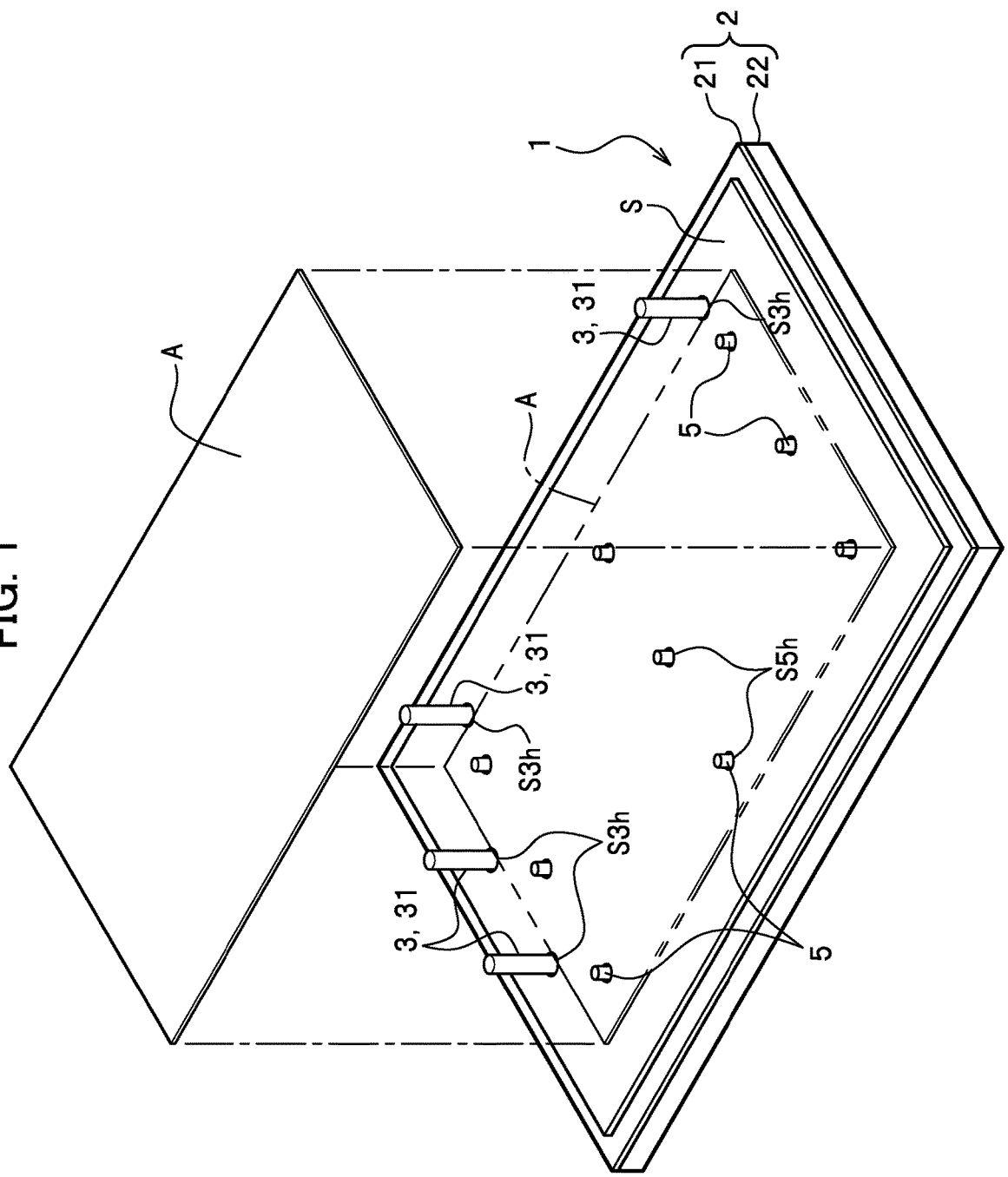
FIG. 1 is a perspective view schematically showing an adhering jig according to one embodiment of the present disclosure, with an adhesion target and an adhesion target.

Certain embodiments of the present disclosure will be described below with reference to the drawings. However, the embodiments illustrated below are to exemplify an adhering jig and an adhering method for embodying the technical idea of the present invention, and the technical idea of the present invention is not limited thereto. The sizes, materials, shapes and the relative positions of the members described in the embodiments are given as examples and not as a limitation to the scope of the invention unless specifically stated. The sizes and positional relationships of the members in each of drawings are occasionally shown exaggerated for ease of explanation. Also, the size and/or space or interval of components may not be the same between a plan view, a cross-sectional view, a perspective view, etc. In the description below, the same designations or the same reference numerals denote the same or like members and duplicative descriptions will be appropriately omitted. Further in the present specification, the terms such as "upper" and "lower" are used to illustrate a relative locational relationship between the components, and are not intended to show absolute positional relationship.

Adhering Jig

Figure 2:
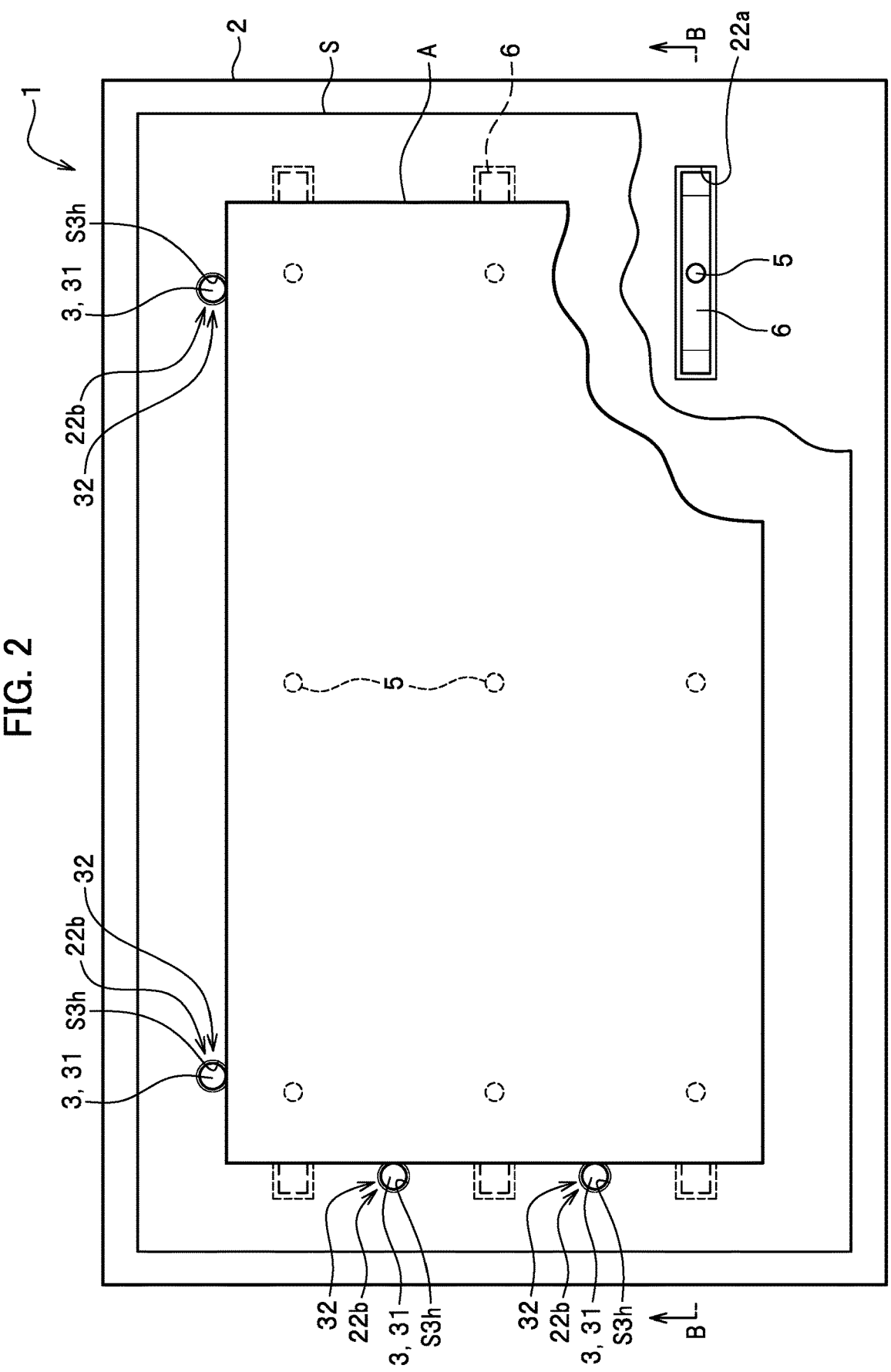
FIG. 2 is a plan view including a partially cut-off section, schematically showing an adhesion target and adhesive member being aligned and placed on the adhering jig according to the present embodiment.
Figure 3:
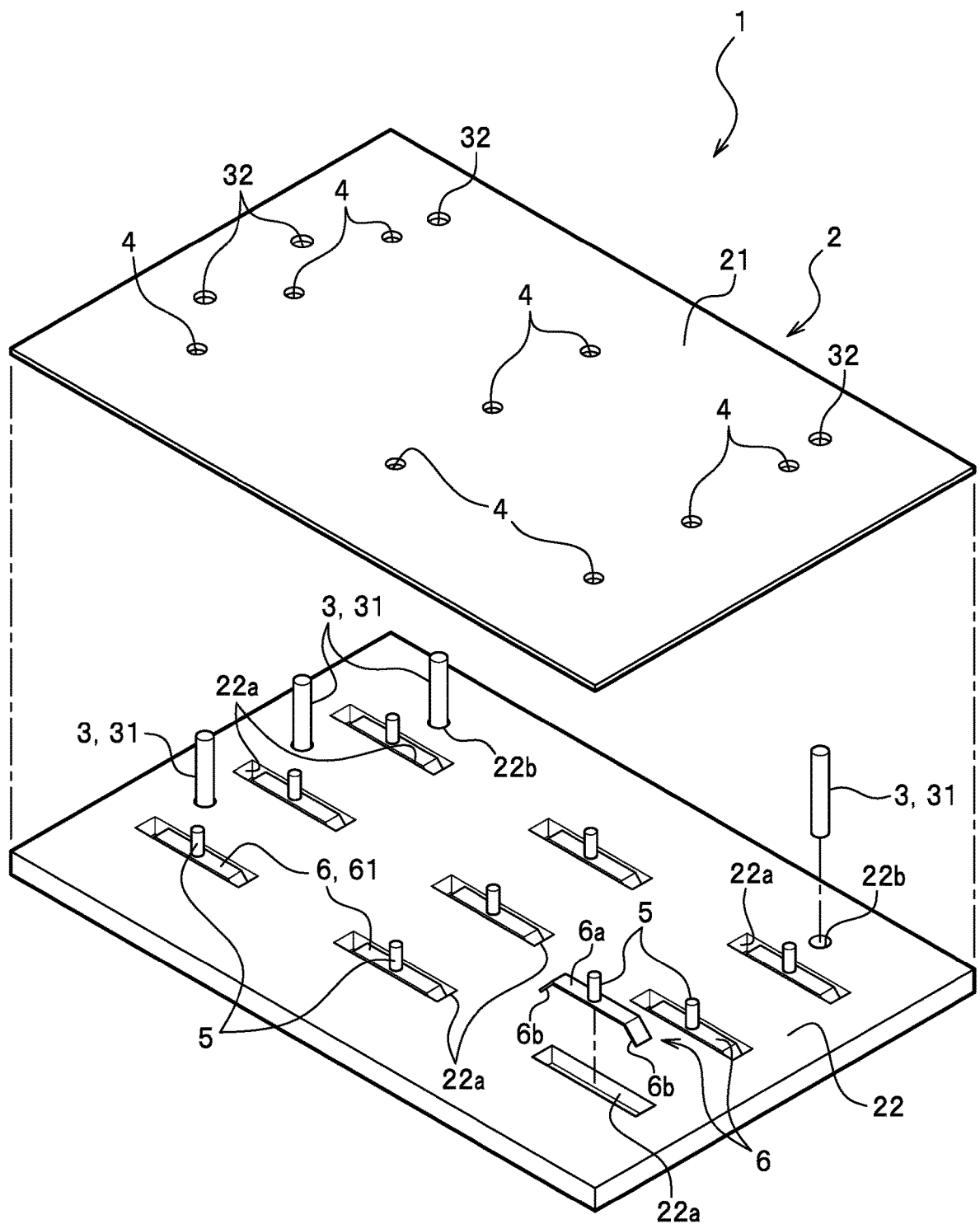
FIG. 3 is a schematic exploded perspective view of a mounting plate that is a component of the adhering jig according to the present embodiment.
Figure 4:
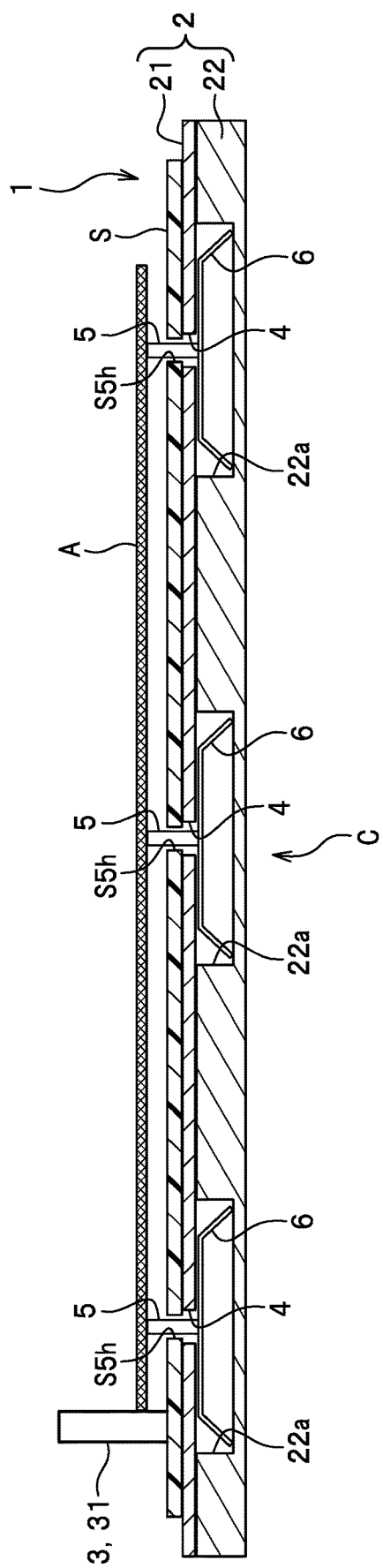
FIG. 4 is a cross-sectional view taken along line B-B in FIG. 2.
Figure 5:
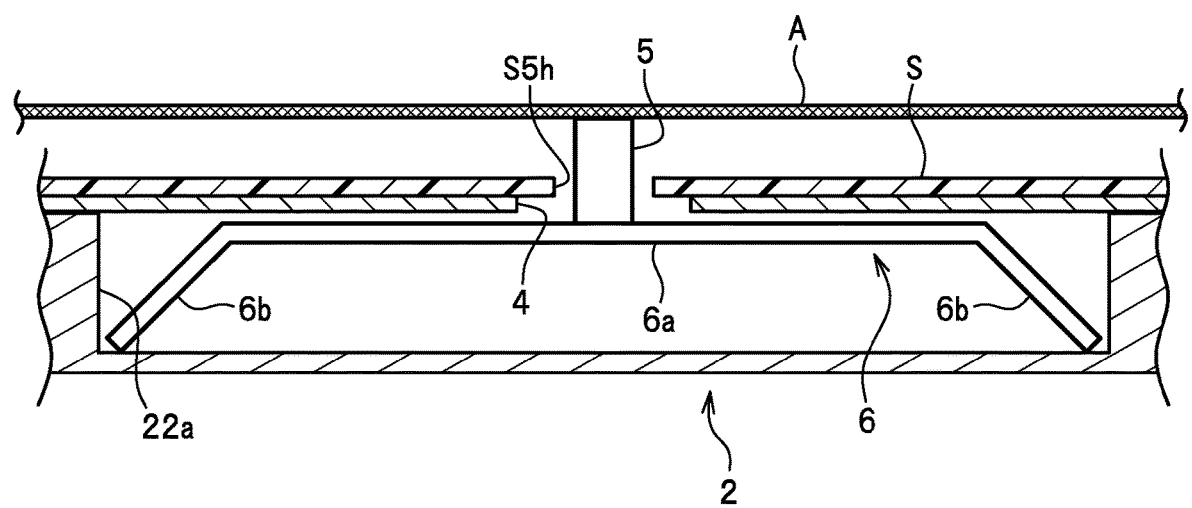
FIG. 5 is an enlarged view of a portion indicated by C in FIG. 4.

An adhering jig will be described. FIG. 1 is a schematic perspective view of an adhering jig according to one embodiment of the present disclosure, shown with an adhesion target S and an adhesive member A. FIG. 2 is a plan view including a partially cut-off section, schematically showing an adhesion target S and an adhesive member A being aligned and placed on the adhering jig 1 according to the present embodiment. FIG. 3 is an exploded perspective view of a mounting plate 2 that is a component of the adhering jig 1 according to the present embodiment. FIG. 4 is a cross-sectional view taken along line B-B in FIG. 2. FIG. 5 is an enlarged view of a portion indicated by C in FIG. 4.

As shown in FIG. 1 through FIG. 5, the adhering jig 1 includes a mounting plate 2, a plurality of aligning parts 3 located on the mounting plate 2, a plurality of first holes 4 formed in an exterior surface of the mounting plate 2. The adhering jig 1 further includes a plurality of first pins 5 and a plurality of first adjusting members 6. The plurality of first pins are disposed in the plurality of first holes 4, and are allowed to move in a direction perpendicular to the upper surface of the mounting plate 2. The plurality of first adjusting members 6 are disposed inward with respect to the upper surface of the mounting plate 2, and are configured to support the first pins 5 and to adjust movements of the first pins 5 in the direction perpendicular to the upper surface of the mounting plate 2. In the adhering jig 1, the first adjusting members 6 are configured to exert an opposite force to the force applied through the first pins, when the first pins 5 are pressed in the first holes 4 of the mounting plate 2. As described above, the first member 21 is formed with the plurality of first holes 4 that are openings of first housing 22a (described later below) configured to accommodate the first adjusting members 6, such that at least a portion of the first pins 5 affixed on the first adjusting members 6 can be lowered in the first holes 4 leading to the first housings 22a. Accordingly, in the present specification, movement lowering the first pins 5 may be referred to as accommodating, moving, pressing, etc., the first pin(s) 5 in the first holes 4.

The adhering jig 1 is designed to align the adhesion target S (for example, a substrate) and the adhesive member A (for example, a bonding member) at respective aligning parts 3 and bond to each other. Aligning the adhesion target S and the adhesive member A at the aligning parts 3 allows bonding at an appropriate configuration. In the present embodiment, proper aligning of the adhesion target S and the adhesive member A by using the aligning parts may be referred to as "aligning".

The adhesion target S is a member to which the adhesive member A is bonded. Examples of the adhesion target S includes a substrate provided with a wiring (a wiring substrate). The substrate may be a flexible substrate. The adhesion target S is formed with a plurality of first through-holes S5$h$ at locations matching the plurality of first holes 4 formed in the mounting plate 2 to allow the plurality of first pins 5 to be inserted through the plurality of first through-holes S5$h$. Accordingly, the plurality of first pins 5 engaged in the plurality of first holes 4 are inserted through the plurality of first through-holes S5$h$ of the adhesion target S, such that at least upper ends of the plurality of first pins 5 can be protruded out of the surface of the adhesion target S. This arrangement allows the first pins 5 to support the adhesive member A spaced apart from the adhesion target S. Further, upon the first pins 5 being inserted through the first through-holes S5$h$ of the adhesion target S, movement of the adhesion target Sin lateral directions is restricted. In other words, the adhesion target S can be positioned not only by using the aligning parts 3 but also by using the first pins 5 inserted through the first through-holes S5$h$.

The first holes 4 may be formed with a diameter greater than the diameter of the first pins 5. In view of easiness in moving the first pins 5 and their positional deviation in a lateral direction, for example, the diameter of the first holes 4 can be 0.1 to 4.0 mm greater, more preferably 0.5 to 2.0 mm greater than the diameter of the first pins 5. The diameter of the first holes 4 can be in a range of 1.5 to 7.0 mm. From such relationship between the diameter of the first holes 4 and the diameter of the first pins 5, the diameter of the first pins 5 can be determined as (the diameter of the first holes 4) minus (0.1 to 4.0 mm).

The adhesive member A is a member to be adhered to the adhesion target S. The adhesive member A has an adhesive layer on a surface facing the adhesion target S. When the adhesive member A is mounted on the upper ends of the first pins 5, the adhesive member A can be temporary secured by the adhesive layer with an adhesive power so as not to be easily separated. Accordingly, after the adhesive member A is mounted on the upper ends of the first pins 5, removing the aligning parts 3 from the adhering jig 1 will not easily cause positional shift of the adhesive member A.

The adhesive member A can be formed with a base material that is a resin sheet made of an appropriate resin such as polypropylene resin, polyethylene resin, polyethylene terephthalate resin, or the like, and an appropriate adhesive layer is disposed on a surface of the resin sheet that faces the adhesion target S. The adhesive member A may be formed with a base member having an adhesive layer on both sides. More specifically, a bonding member having an adhesive layer at both sides of a base material can be used as the adhesive member A. Such an adhesive member A may be provided with a separator (for example, a release sheet made of PET) covering each of the adhesive layers. After removing one of the separators, the adhesive member A is mounted on the upper ends of the first pins 5 such that the adhesive layer is abutted to the upper ends of the first pins 5. The separator on the other side of the adhesive member A can be removed in a subsequent step when the adhesive member A is adhered to a different member etc.

The mounting plate 2 has an upper surface on which the adhesion target S is placed, such that the adhesive member A can be adhered to the adhesion target S. In order to place the adhesion target S, the upper surface of the mounting plate 2 is formed flat except for the first holes 4 and a plurality of second holes 32 to be described below. The flat upper surface of the mounting plate 2 allows for stable placing of the adhesion target S and also can facilitate stable, uniform bonding when the adhesive member A is adhered to the adhesion target S.

The mounting plate 2 includes, for example, a first member 21 defining the plurality of first holes 4 and a second member 22 provided with a plurality of first adjusting members 6. The first member 21 and the second member 22 are disposed opposite to each other. Further, the first holes 4 of the first member 21 and the first adjusting members 6 of the second member 22 are located opposite to each other. The plurality of first pins 5 are disposed on the plurality of first adjusting members 6 that allows for movement of the first pins 5 in the perpendicular direction through the first holes 4. In the present embodiment, the second member 22 is located at a lower side in the mounting plate 2 and is configured to accommodate the first adjusting members 6 and to serve as a base that supports the first member 21. The first member 21 is located at an upper side in the mounting plate 2 and is configured to cover the first adjusting members 6 and to receive the adhesion target S thereon as described above.

The mounting plate 2 is further formed with a plurality of second holes 32, and a plurality of second pins 31 are disposed penetrating the second holes 32. In the configuration described above, the second pins 31 serve as the aligning parts 3. More specifically, the first member 21 of the mounting plate 2 is formed in a rectangular plate-like shape. The first member 21 is formed with a plurality of first holes 4 located to allow the first pins 5 to pass through. The first member 21 is also formed with a plurality of second holes 32 located to allow the second pins 31 pass through. The first member 21 has a lower surface disposed facing the second member 22 such that the lower surface of the first member 21 except for the first holes 4 and the second holes 32 is in contact with the upper surface of the second member 22.

The second holes 32 are formed with a diameter greater than the diameter of the second pins 31. The second holes 32 are preferably formed with a small deviation in a lateral direction, more preferably formed without a deviation in a lateral direction. For example, with respect to the diameter of the second holes 32, the second pins 31 has a diameter of preferably 200 μm or less, more preferably 100 μm or less, further preferably 50 μm or less. With the arrangement described above, aligning accuracy between the adhesion target S and the adhesive member A can be improved, for example, positional deviation within 100 μm, more preferably within 50 μm can be achieved. For example, the diameter of the to the second pins 31 can be in a range of about 0.4 mm to about 0.45 mm. For example, the diameter of the second holes 32 can be determined as (the diameter of the second pins 31) plus (200 μm or less).

The second member 22 accommodates the first adjusting members 6, and the upper surface of the second member 22 receives the lower surface of the first member 21. The second member 22 includes a plurality first housing 22a accommodating the plurality of first adjusting members 6, and a plurality of second pins 31 disposed at predetermined intervals at a peripheral portion of the second member 22. The second pins 31 are located at positions such that the second pins 31 can serve as the aligning parts 3 to which the outer periphery of the adhesive member A are abutted and aligned. In the present embodiment, the second member 22 has a rectangular plate shape having a predetermined thickness and formed with a plurality of first housings 22a. The first housings 22a can be, for example, recesses formed in a rectangular shape in a plan view. Each of the first housings 22a is formed with a depth that allows elastic deformation of a corresponding one of the first adjusting members 6 accommodated therein, and with a volume that allows the elastically deformed first adjusting member 6 for abutting one or more lateral surfaces defining the first housing 22a to exert it adjusting function. For example, the second member 22 includes the first housings 22a formed equally aligned in three rows and three columns. The second member 22 defines a plurality of supporting holes 22b to removably receive and support the plurality of second pins 31. The supporting holes 22b formed in the second member 22 and the second holes 32 formed in the first member 21 are aligned to coincide with each other in the mounting plate 2. Accordingly, each of the second pins 31 can be disposed through a corresponding one of the second holes 32 and removably supported in a corresponding one of the supporting holes 22b.

As described above, the plurality of first adjusting members 6 are disposed inward with respect to the plane of the exterior surface of the mounting plate 2, and are configured to support the first pins 5 and to adjust movements of the first pins 5 in the direction perpendicular to the plane of the exterior surface of the mounting plate 2. The first adjusting members 6 are, when the plurality of first pins 5 are pressed in the first holes 4 of the mounting plate 2, configured to exert opposite force to the pressing force applied through the plurality of first pins 5. More specifically, the first adjusting members 6 can be made of an elastic member and has a structure configured to allow a movement of the first pins 5 supported by the first adjusting members 6, within a predetermined range in a direction perpendicular to the plane of the exterior surface of the mounting plate 2. In the present embodiment, the first adjusting members 6 are accommodated in the first housing 22a formed in the second member 22, such that the first adjusting members 6 are located at predetermined intervals. As described above, the first member 21 cover the first adjusting members 6 with the first pins 5 penetrating through the first holes 4. Accordingly, the first adjusting members 6 are prevented from detaching out from the plane of the exterior surface of the second member 22.

For example, each of the first adjusting members 6 can be formed with a plate spring or a coil spring. When each of the first adjusting members 6 is formed with a plate spring, both longitudinal end sides of a rectangular plate-shaped material can be bent at a predetermined angle to form a flat portion 6a in a center portion and support leg portions 6b and 6b at both sides of the flat portion 6a, and an end of a single first pin 5 is attached to a center of the flat portion 6a of each of the first adjusting members 6. The first adjusting member 6 is configured to elastically deform in the perpendicular direction such that the first pin 5 protruding out of the first hole 4 is allowed to move perpendicularly downward to be accommodated within the first hole 4 by elastic deformation of the first adjusting member 6. When the first pins 5 are pressed in the first holes 4 of the mounting plate 2, the first adjusting members 6 are elastically deformed to a degree the flat portions 6a are brought in contact with the upward-facing surfaces of the first housings 22a or the flat portions 6a are curved toward the upward-facing surface of the first housings 22a, and then suitably exert a restoring force in the direction opposite to the pressing force applied through the first pins 5. The spring strength of the plate spring or coil spring can be adjusted. For example, the spring strength of the plate spring or coil spring may be increased or reduced as appropriate, according to the weight of the adhesive member A.

The first adjusting members 6 preferably can exert a restoring force, for example, in a range of 0.15 N to 180 kN in the direction opposite to the applied pressure. When the restoring force is in the range described above, the pressure required to adhere the adhesion target S and the adhesive member A can be in an appropriate range that allows achievement of good bonding therebetween. In view of achieving further reliable and efficient bonding between the adhesion target S and the adhesive member A, the restoring force is preferably in a range of 0.2 N to 96 kN, more preferably in a range of 40 kN to 50 kN.

The first pins 5 are configured to have a length such that when the first adjusting members 6 are elastically deformed, the upper ends of the first pins 5 are lowered within the first holes 4, and when the first adjusting members 6 are not elastically deformed, the upper ends of the first pins 5 are located above the plane of the upper surface of the adhesion target S. In other words, the first pins 5 are configured to have a length such that when the first pins 5 are moved downward in a perpendicular direction to a lowest position, the upper ends of the first pins 5 are at a substantially same height as the plane of the upper surface of the adhesion target S placed on the first member 21, and when the first pins 5 are raised in a perpendicular direction to a highest position, the upper ends of the first pins 5 are above the plane of the upper surface of the adhesion target S placed on the first member 21. The first pins 5 are formed to have flat upper ends. Further the first pins 5 are formed with a diameter that allows the first pins 5 to move in the perpendicular direction through the first holes 4. It is preferable that at least a portion of the surfaces of the first pins 5 are covered by a fluororesin, because, with this arrangement, when the adhesive member A and the first pins 5 are bonded by the adhesive layer, the adhesive member A can be easily removed from the first pins 5. The upper ends of the first pins 5 can be rounded. Further, an emboss-processing may be applied on the surfaces of the first pins 5. Such arrangements allow a reduction in contact area of each of the first pins 5 with the adhesive member A, such that when the adhesive member A and the first pin 5 are adhered to each other, the adhesive member A can be easily detached from the first pin 5.

The aligning parts 3 are provided on the mounting plate 2 and are configured to position the adhesion target S and the adhesive member A to respective predetermined positions. For the aligning parts 3, the second pins 31 can be used as described above. The mounting plate 2 includes the first member 21 defining the second holes 32 and the second member 22 defining the supporting holes 22b. The second pins 31 are located in the second holes 32 and are removably affixed in the supporting holes 22b formed in the second member 22. The second pins 31 are allowed to project from the second through-holes S3h formed in the adhesion target S such that upper ends of the second pins 31 are projected over the plane of the upper surface of the adhesion target S. The second pins 31 are located at positions to where lateral ends of the adhesive member A abut, more specifically, at positions to where two perpendicularly adjacent sides of the adhesive member A abut are determined as placing positions of the adhesive member A, such that the adhesive member A can be aligned with the adhesion target S. In the present embodiment, the second through-holes S3h of the adhesion target S, the second holes 32 of the first member 21, and the supporting holes 22b of the second member 22 are formed at locations coincide with each other. The second pins 31 affixed in the supporting holes 22b are also inserted through the second through-holes S3h, thereby allowing aligning of the adhesion target S.

The second pins 31 are also configured to allow lateral edges of the adhesive member A abutting thereto to position the adhesive member A. In the example shown in FIG. 2, all the second pins 31 are inserted through the second through-holes S3h, but other configuration may be employed. The second pins 31 are configured to position the adhesive member A, for example, the second pins 31 are inserted through a total of two or more second through-holes S3h such that at least one second pin 31 is in contact with each of the two orthogonal sides of the adhesive member A. Even when the second pins 31 are positioned in this way, lateral movement of the adhesion target S and of the adhesive member A can be prevented, allowing for aligning of the adhesion target S and the adhesive member A.

The second pins 31 can be removed after aligning and before adhering the adhesion target S and the adhesive member A. Accordingly, the second pins 31 will not be obstacle when the adhesion target S and the adhesive member A are adhered to each other. It is preferable that the surfaces of the second pins 31 are covered by a fluororesin, as the first pins 5. The portions of the second pins 31 that are configured to be in contact with the adhesive member A may have embossed surfaces. With the arrangements as described above, the adhesive member A can be easily detached from the second pins 31 when the adhesive member A and the second pins 31 are adhered through an adhesive layer.

It is preferable to attach the adhering jig 1 to a known laminator that employs a diaphragm (film) D, and then adhere the adhesion target S and the adhesive member A to each other. Such a laminator has a chamber and a diaphragm D in the chamber. The diaphragm D is configured to expand and apply a pressure to an object (for example, the adhesion target S and the adhesive member A mounted in this order on the mounting plate 2 of the adhesion jig 1) when supplied with a fluid (for example, a gas or a liquid). Accordingly, the diaphragm can adhere the adhesion target S and the adhesive member A mounted on the mounting plate 2 of the adhesion jig 1.

The smaller a change in the shape of the adhesive member A upon being mounted on the first pins 5 and the smaller a weight of the adhesive member A, the smaller pressure to be required to adhere the adhesion target S and the adhesive member A. When the adhesion between the adhesion target S and the adhesive member A is low, it is preferable to increase the pressure or to apply heat during adhesion. For example, adhesion may be performed at a temperature in a range of 40 to 70° C.

The adhering jig 1 has a structure described above such that temporarily prior to adhesion, the adhesive member A can be held spaced apart above the adhesion target S and kept in the state. The adhesive member A is pressed to the adhesion target S to adhere through predetermined resistance and distance, such that the adhesive member A and the adhesion target S are not easily adhered each other without performing a predetermined operation. Accordingly, subsequent operations and steps of adhesion can be appropriately performed with the adhering jig 1, such that voids are hardly formed when the adhesion target S (for example, a substrate) and the adhesive member A (for example, a bonding member) are adhered.

In the present embodiment, known materials can be used for the first member 21, the second member 22, the first pins 5, and the second pins 31 of the adhering jig 1. For example, stainless steel, aluminum alloy, ceramic, and/or resin can be used, of those, stainless steel is preferable.

For the first adjusting members 6, a known metal material can be used, of which, stainless steel is preferable.

Bonding Method

Figure 6:
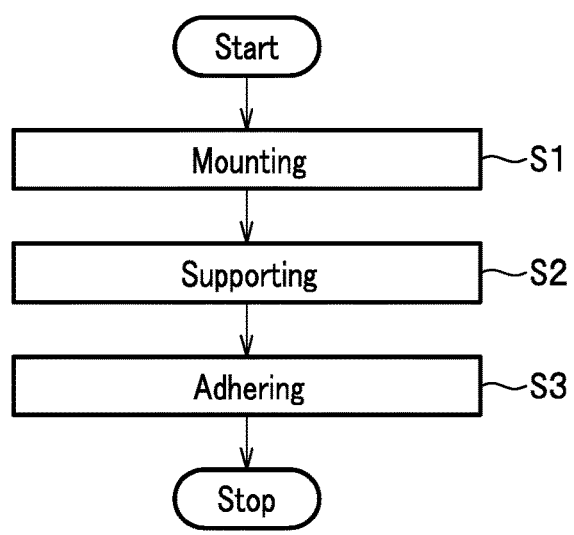
FIG. 6 is a flowchart illustrating operations of an adhering method according to the present embodiment.
Figure 7A:
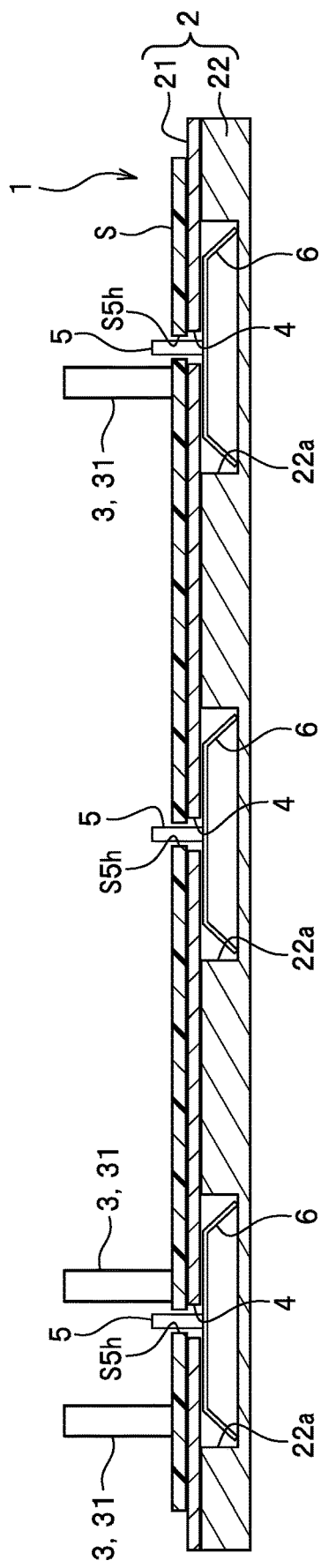
FIG. 7A is a schematic cross-sectional view illustrating a state before an adhesive member is positioned onto a plurality of first pins of the adhering jig according to the present embodiment.
Figure 7B:
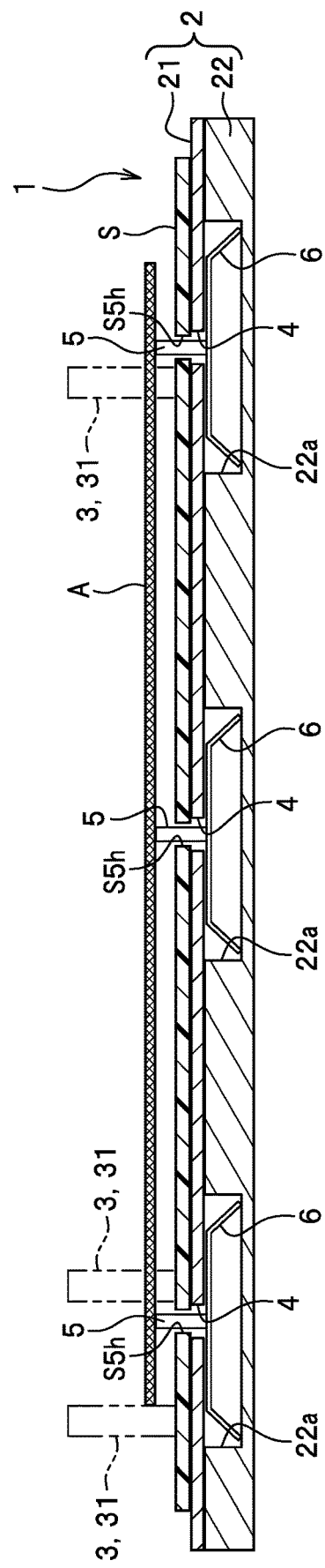
FIG. 7B is a schematic cross-sectional view illustrating a state after aligning the adhesion target and the adhesive member by using a plurality of second pins, the plurality of second pins are removed.
Figure 7C:
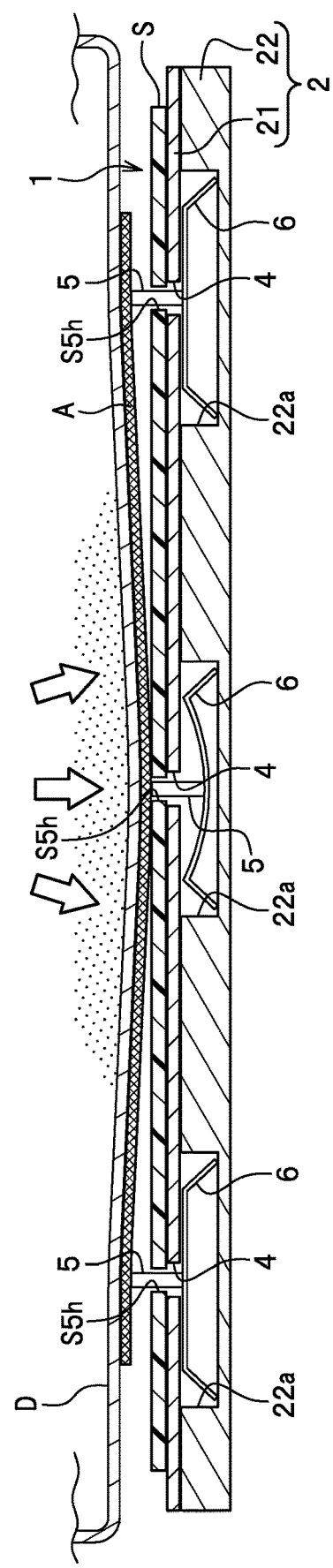
FIG. 7C is a schematic cross-sectional view illustrating a state in which a center portion of the adhesion target and a center portion of the adhesive member are adhered to each other in the adhering jig according to the present embodiment.
Figure 7D:
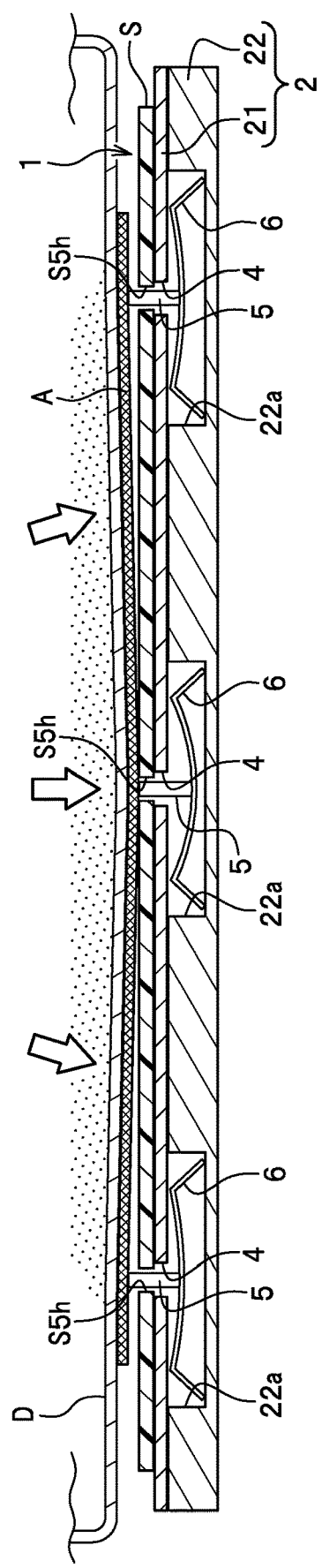
FIG. 7D is a schematic cross-sectional view illustrating a state in which the adhesion target and the adhesive member are being bonded from center portions toward peripheral portions, in the adhering jig according to the present embodiment.
Figure 7E:
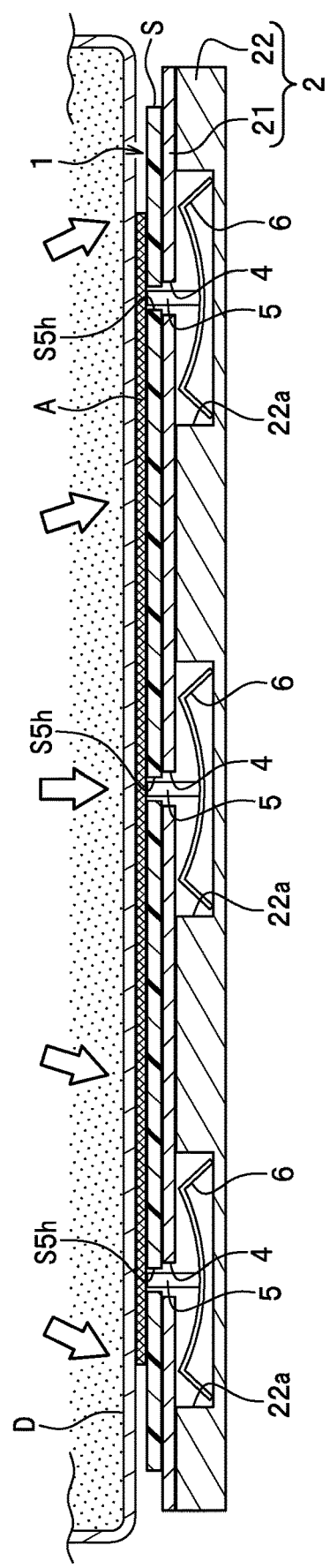
FIG. 7E is a schematic cross-sectional view illustrating a state in which the adhesion target and the adhesive member have been adhered to each other in the adhering jig according to the present embodiment.

Next, an adhering method according to the present embodiment will be described. FIG. 6 is a flowchart illustrating operations of the adhering method (hereinafter may be referred simply to as "present method") according to the present embodiment. FIG. 7A is a schematic cross-sectional view illustrating a state before an adhesive member is positioned onto a plurality of first pins 5 of the adhering jig 1 according to the present embodiment. FIG. 7B is a schematic cross-sectional view illustrating a state after aligning the adhesion target S and the adhesive member A by using a plurality of second pins 31 and the plurality of second pins 31 are removed. FIG. 7C is a schematic cross-sectional view illustrating a state in which a center portion of the adhesion target S and a center portion of the adhesive member A are adhered to each other in the adhering jig 1 according to the present embodiment. FIG. 7D is a schematic cross-sectional view illustrating a state in which the adhesion target S and the adhesive member A are being bonded from center portions toward peripheral portions, in the adhering jig 1 according to the present embodiment. FIG. 7E is a schematic cross-sectional view illustrating a state in which the adhesion target S and the adhesive member A have been adhered to each other in the adhering jig 1 according to the present embodiment.

The present method is designed to provide a method for adhering the adhesive member A to the adhesion target S using the adhering jig 1, the method includes mounting S1, supporting S2, and adhering S3, which can be performed in this order. In the step of adhering S1 illustrated below, a diaphragm (film) D of a laminator is used with the adhering jig 1. When a fluid is used in the step of adhering S3, the temperature of the fluid can be appropriately adjusted, such that operation of adhesion can be carried out adapting to an operation environment.

As shown in FIG. 7A, in the step of mounting S1, the adhesion target S is disposed on the mounting plate 2 by engaging the plurality of the first through-holes S5h with the plurality of first pins 5. Each of the first pins 5 is configured to be affixed on a corresponding one of the plurality of first adjusting members 6, such that when pressed, a repulsive force against the direction of applied pressure is exerted through the first pins 5. The first pins 5 can be inserted in the first through-holes S5h either before or after placing the adhesion target S on the mounting plate 2. By the step of mounting S1, the plurality of first pins 5 are protruded over the upper surface of the adhesion target S, such that in a later step, the adhesion target S can be supported by the protruding ends of the first pins 5 spaced apart from the upper surface of the adhesion target S at a protruding distance of the first pins 5.

As shown in FIG. 7B, in the step of supporting S2, the adhesive member A is disposed on the protruding ends of the first pins 5 spaced apart from the upper surface of the adhesion target S, and also the adhesive member A is positioned by abutting against the aligning parts 3. In the step of supporting S2, because the adhesive member A has a rectangular sheet shape or a rectangular plate-like shape, two adjacent sides of the rectangular shape of the adhesive member A are abutted against the second pins 31 provided as the aligning parts 3. In the example shown in FIG. 7B, the adhesion target S and the adhesive member A are positioned while the lateral ends of two of the adhesive member A are abutting against the second pins 31. Through the step of supporting S2, the adhesion target S is mounted on the upper surface of the mounting plate 2 in a state positioned by the aligning parts 3 (second pins 31), such that in a later step, the adhesive member A and the adhesion target S can be adhered to each other while the adhesion target S is in a state positioned by the aligning parts 3 (second pins 31) on the upper surface of the mounting plate 2. After the step of supporting S2 and before the step of adhering S3, the second pins 31 are removed from the second member 22 of the mounting plate 2. Further, the adhesive member A has an adhesive layer on a surface facing the adhesion target S, and the adhesive member A is temporarily secured to the aligning of the first pins 5 by the adhesive layer. Accordingly, even the aligning parts 3 are removed from the adhering jig 1, the position of the adhesive member A will not be easily shifted.

As shown in FIG. 7C, in the step of adhering S3, the first pins 5 are moved in the perpendicular direction against the restoring force exerted from the first adjusting members 6 to accommodating at least a portion of certain first pins 5 in the first holes 4, while pressing the adhesive member A to the adhesion target S to adhere to the adhesion target S. In the step of adhering S3, immediately before pressing the adhesive member A to the adhesion target S to adhere, the adhesive member A is supported spaced apart above the adhesion target S by the repulsive force of the first adjusting members 6 and the length of the first pins 5, such that the adhesive member A is not easily adhered without performing a predetermined operation.

Further, in the step of adhering S3, the adhesive member A and the adhesion target S are pressed each other from a center portion toward outer periphery of the adhesive member A. That is, in the step of adhering S3, for example, a center portion of the diaphragm D of the laminator is expanded. Accordingly, the first pins 5 located at a center portion of the mounting plate 2 are pressed perpendicularly downward against the restoring force exerted from the first adjusting members 6. The center portion of the adhesive member A and a center portion of the adhesion target S are pressed to each other and are press-adhered to each other.

Further, as shown in FIG. 7D, in the step of adhering S3, the diaphragm D is gradually expanded from the portion at center side toward outer peripheral side of the adhesive member A. With the expansion of the diaphragm D, a range of pressure applied to the first pins 5 expands from the first pins 5 located at the center portion of the mounting plate toward the first pins 5 located at outer peripheral side of the mounting plate 2. That is, a range of pressure applied on the first pins 5 in a direction perpendicularly downward against the repulsive force of the first adjusting members 6 expands. With the expansion of the range pressed by the diaphragm D, the adhesive member A and the adhesion target S are press-adhered to each other from their center portions to outer peripheral portions. Further, as shown in FIG. 7E, the entire of the diaphragm D is expanded to cover the entire of the upper surface side of the mounting plate 2 and the entire of the adhesive member A is pressed downward, such that the adhesive member A and the adhesion target S are adhered to each other throughout their interface at their predetermined locations. As described above, adhering the adhesive member A and the adhesion target S from the center toward the outer periphery allows avoiding entering of the air, such that voids between the adhesive member A and the adhesion target S are further hardly generated.

In the example illustrated in FIGS. 7C, 7D, and 7E, the diaphragm D is expanded slowly against the center portion of the adhesive member A toward the outer periphery of the adhesive member A, but the expansion of the diaphragm D can be applied differently. For example, the pressure may be applied against the adhesive member A, from one end of the outer periphery across to the other end of the periphery of the adhesive member A. In this way, with the expansion of the diaphragm D, a range of pressure applied to the first pins 5 expands from the first pins 5 located at one outer peripheral end portion of the mounting plate 2 across to the first pins 5 located at the opposite side of outer peripheral end portion of the mounting plate 2, such that the adhesive member A and the adhesion target S are press-adhered to each other from one end to the other end of the outer periphery. Also in this way, entering of the air between the adhesive member A and the adhesion target S can be avoided and voids between the adhesive member A and the adhesion target S are hardly formed.

In the step of adhering S3, when the adhesive member A and the adhesion target S are adhered to each other at respective predetermined locations, the first pins 5 are not required to be entirely accommodated in the respective first holes 4 of the mounting plate 2.

The step of adhering S3 described above are illustrated as performed under the atmospheric pressure, but may also be performed in a vacuum. In the step of adhering S3, the adhesion target S and the adhesive member A are preferably adhered to each other using a known vacuum laminator employing a diaphragm D. Such a vacuum laminator has a vacuum chamber provided with a diaphragm D. When using a vacuum laminator, the air is not present around the adhesive member A and the adhesion target S, such that at the time of adhering, voids between the adhesive member A and the adhesion target S are further hardly formed. Accordingly, the adhesive member A and the adhesion target S can be adhered more reliably and uniformly. As described above, a portion of the adhesive layer of the adhesive member A is adhered to the first pins 5 and the first pins 5 and the second pins 31 are inserted through the adhesion target S, which allows for conducting aligning and adhering operation without hindrance, which can be more facilitated in a vacuum environment.

Variant Examples

Figure 8:
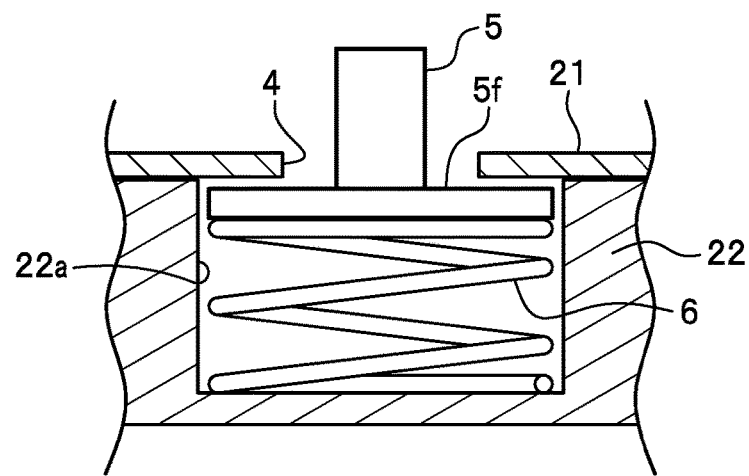
FIG. 8 is a schematic cross-sectional view illustrating a variant example of a first adjusting member.

Next, variant examples according to the present embodiment will be described. FIG. 8 is a schematic cross-sectional view illustrating a variant example of the first adjusting member 6. FIGS. 3 through 5 illustrate a plate spring as the first adjusting member 6, but in place of the plate spring, a coil spring can be employed as the first adjusting member 6 as shown in FIG. 8. In a similar manner as the plate spring, a coil spring allows movement of the first pins 5 in the perpendicular direction, and similarly, the adhesive member A and the adhesion target S can be adhered to each other. When a coil spring is used as each of the first adjusting members 6, in order to prevent the first pins 5 from coming out of the first hole 4, a flange 5f having a diameter greater than the diameter of the first hole 4 is preferably affixed to the spring coil. When each of the first adjusting members 6 is made of a coil spring with a flange 5f affixed to an upper portion of the coil spring, one end of one of the first pins 5 is affixed to the center of the flange 5f, such that the first pin 5 in a state of protruding from the first hole 4 can be moved in a perpendicular direction to be accommodated in the first hole 4, due to elastic deformation of the first adjusting member 6. That is, when the first adjusting members 6 are formed as described above, when the first pins 5 are pressed in a direction accommodating the first pins 5 in the first holes 4 of the mounting plate 2, the coil springs are compressed and elastically deformed, which can then suitably exert opposite force to the pressing force applied through the coil springs.

Figure 9:
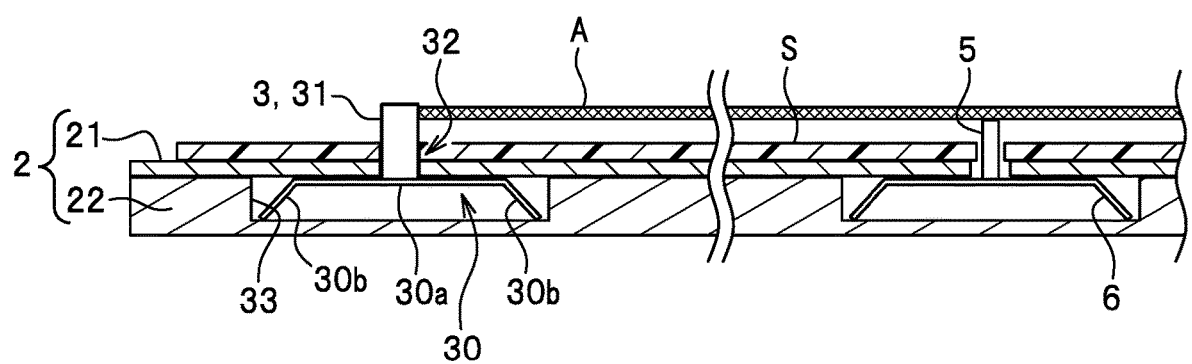
FIG. 9 is a schematic cross-sectional view illustrating a variant example of a configuration of one of the second pins and its corresponding second adjusting member.

FIG. 9 is a schematic cross-sectional view illustrating a variant example of a configuration of one of the second pins 31 and its corresponding second adjusting member 30. The first member 21 defines a second hole 32 and the second member 22 includes a second adjusting member 30. The aligning part 3 can have a configuration similar to that of the first pin 5 and the first adjusting member 6 described above. That is, the aligning part 3 is disposed inward with respect to the plane of the upper surface of the mounting plate 2, and is configured to support the second pin 31 and to adjust movement of the second pin 31 in the direction perpendicular to the plane of the upper surface of the mounting plate 2. The second pin 31 is allowed to move in a direction perpendicular to the upper surface of the mounting plate 2. The second adjusting member 30 is configured to exert opposite force to the force applied through the second pins 31 when the second pins 31 are pressed in the second holes 32.

In the present variant example, each of the second adjusting members 30 is formed with a plate spring. When each of the second adjusting members 30 is formed with a plate spring, both longitudinal end sides of a rectangular plate-shaped material may be bent at a predetermined angle to form a flat portion 30a and support leg portions 30b and 30b at both sides of the flat portion 30a. An end of a single second pin 31 is affixed to a center of the flat portion 30a of each of the second adjusting members 30. Each of the second adjusting member 30 is configured such that elastic deformation of the second adjusting member 30 allows the second pin 31 that is in a state protruding out of the second hole 32 to move in a direction perpendicularly downward within a range accommodating the second pin 31 in the second hole 32. That is, the second holes 32 and the second adjusting members 30 are located opposite to each other. When the second pins 31 are pressed in the second holes 32 of the mounting plate 2, the second adjusting members 30 are elastically deformed to a degree the flat portions 30a are brought in contact with the upward-facing surfaces of the second housings 33 or the flat portions 30a are curved toward the upward-facing surface of the second housings 33, and suitably exerting an opposite force to the force applied through the second pins 31. The second member 22 is formed with a plurality of second housings 33, each formed in a shape of, for example, a rectangular in a plan view. Each of the second housings 33 is formed with a depth that allows elastic deformation of a corresponding one of the second adjusting members 30 accommodated therein, and with a volume that allows the elastically deformed second adjusting member 30 for abutting one or more lateral surfaces defining the second housing 33 to exert it adjusting function.

In this case, the second pins 31 are configured to have a length such that when the second pins 31 descend in a perpendicular direction to a lowest position, the upper ends of the second pins 31 are at a substantially same height as the plane of an upper surface of the adhesion target S adhered to the adhesive member A, and when the second pins 31 are ascend in a perpendicular direction to a highest position, the upper ends of the second pins 31 are at a location higher than the plane of the upper surface of the adhesion target S supported on the upper ends of the first pins 5.

When the second adjusting members 30 are formed as described above, the second pins 31 configured to be the aligning parts 3 are allowed to move in a perpendicular direction when the adhesion target S and the adhesive member A are adhered to each other by using the diaphragm D described above. Accordingly, the adhesion target S and the adhesive member A can be adhered to each other without removing the aligning parts 3.

Figure 10:
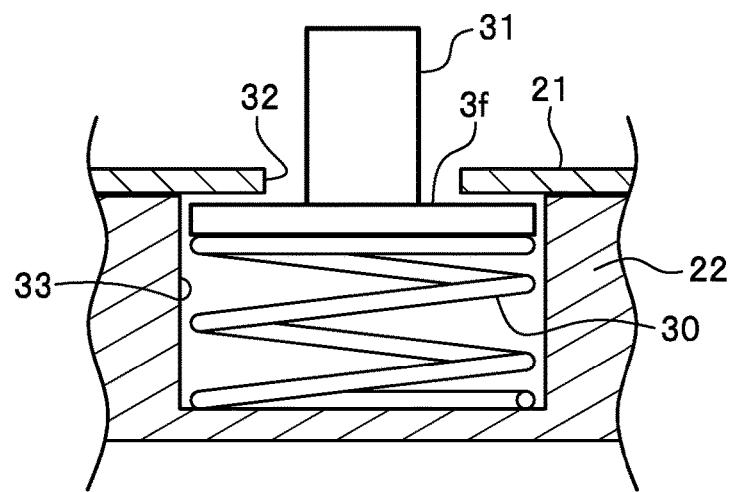
FIG. 10 is a schematic cross-sectional view illustrating another variant example of a configuration of one of the second pins and its corresponding second adjusting member.

FIG. 10 is a schematic cross-sectional view illustrating another variant example of a configuration of one of the second pins 31 and its corresponding second adjusting member 30. In FIG. 9, a plate spring is illustrated as the second adjusting member 30, but in place of the plate spring, a coil spring can be employed as the second adjusting member 30 as shown in FIG. 10. In a similar manner as the plate springs, coil springs can be used to position the adhesion target S and the adhesive member A, and to allow the second pins 31 to move in a direction perpendicularly downward, such that the adhesive member A and the adhesion target S can be adhered to each other. When a coil spring is used as each of the second adjusting members 30, a configuration similar to that of the first adjusting members 6 can be employed. That is, also in this case, a flange 3f is affixed to each of the second pins 31, such that the second pins 31 can be prevented from coming out of the second holes 32. As in the first adjusting members 6, a known metal material can be used for the second adjusting members 30, of which, stainless steel is preferable.

Figure 11:
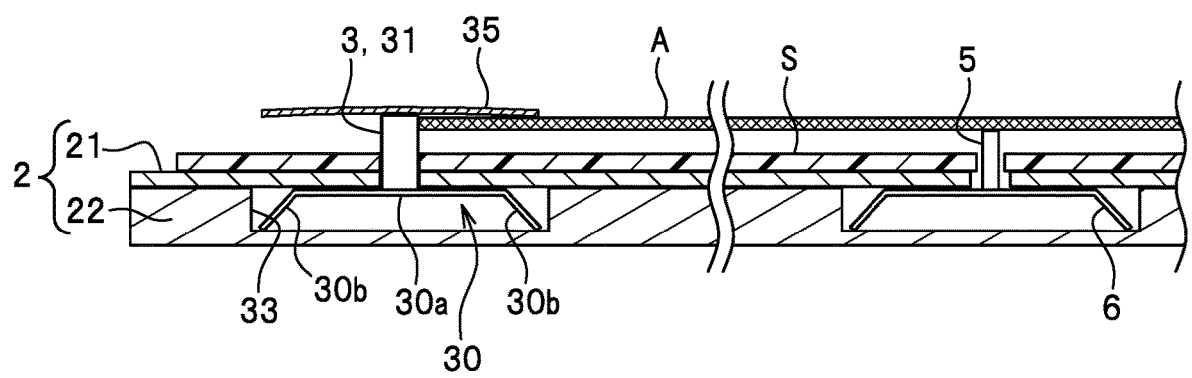
FIG. 11 is a schematic cross-sectional view illustrating a protective cover positioned on an end of one of the second pins.

FIG. 11 is a schematic cross-sectional view illustrating a protective cover 35 positioned on an upper end of the second pin. When the diaphragm D configured to expand by fluid as described above is used to adhere the adhesion target S and the adhesive member A, and also the second pins 31 are configured to move in a perpendicular direction using the second adjusting members 30, the upper ends of the second pins 31 are directly brought in contact with the diaphragm D, which may cause flaw or damage to the diaphragm D. To avoid this, for example, a protective cover 35 having a cross-sectional shape of a gentle arc can be affixed on the upper end of each of the second pins 31. The protective covers 35 can be formed in an appropriate shape such as a circular shape or a circular shape in a plan view. The protective covers 35 can prevent the upper ends of the second pins 31 from directly coming in contact with the diaphragm D, such that damage of the diaphragm D can be prevented.

Figure 12:
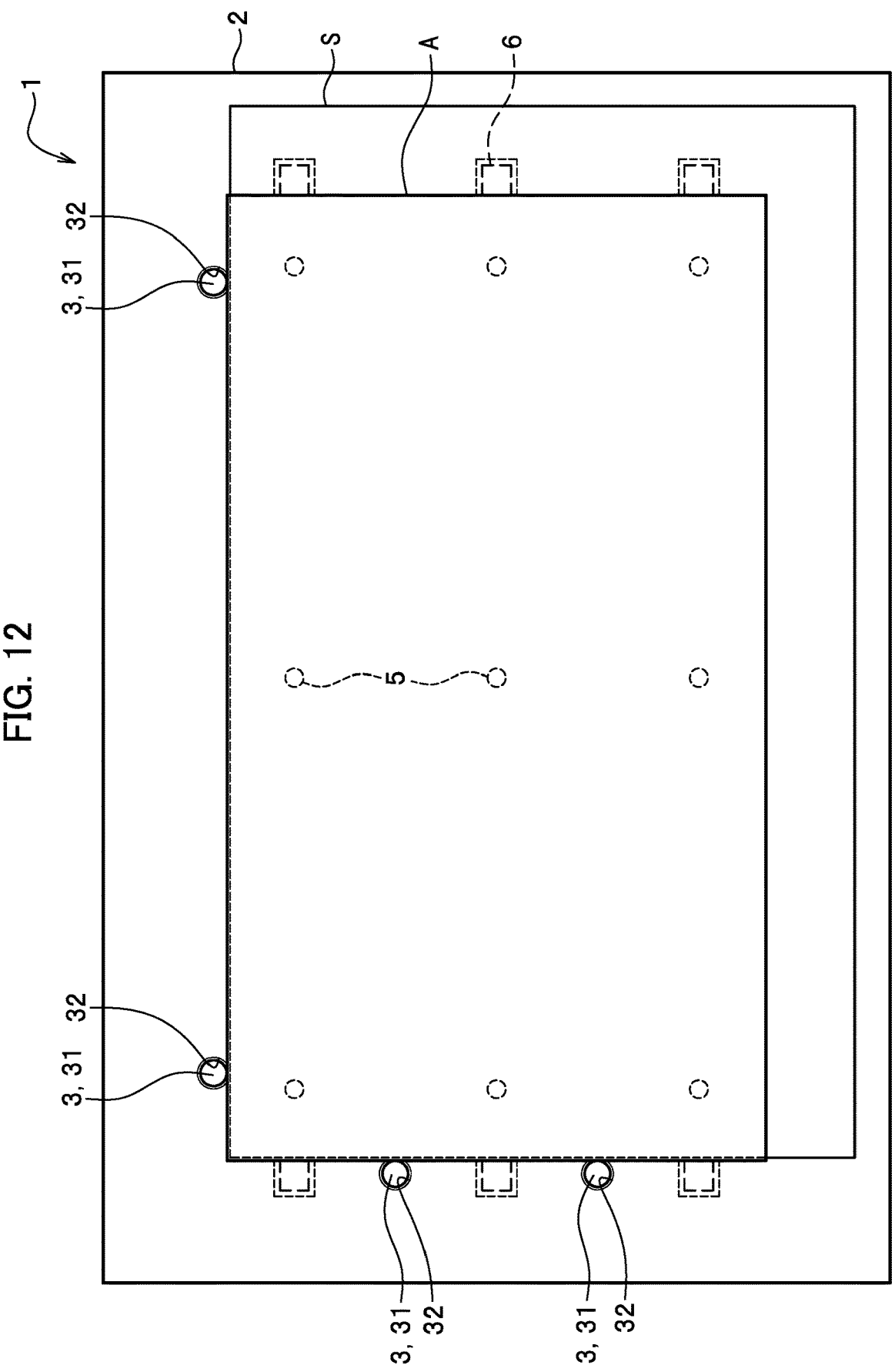
FIG. 12 is a plan view illustrating a variant example according to the present embodiment.

Further variant examples according to the present embodiment will be described below. FIG. 12 is a plan view illustrating one variant example according to the present embodiment. FIG. 13 is a plan view illustrating another variant example according to the present embodiment.

In one variant example of the present embodiment, as shown in FIG. 12, the mounting plate 2, more specifically, the first member 21 is formed with a plurality of second holes 32, a plurality of second pins 31 are disposed in a corresponding one of the second holes 32, the second pins 31 are configured to serve as the aligning parts 3. The aligning location of the adhesion target S and the adhesive member A are determined by the points on the second pins 31 where lateral ends of the adhesion target S and lateral ends of the adhesive member A are brought in contact with the second pins 31. That is, lateral ends of the adhesion target S and lateral ends of the adhesive member A are brought in contact with the second pins 31 to position the adhesion target S and the adhesive member A, which is different from the example illustrated in the embodiment described above. With either of the aligning according to the present variant example or the embodiment described above, aligning of the adhesion target S and the adhesive member A can be appropriately achieved, and thus, can be appropriately selected.

In another variant example of the present embodiment, a plurality of common through-holes 36 are formed through the adhesion target S and the adhesive member A, and as shown in FIG. 13, the mounting plate 2 has a plurality of second pins 31 located at positions designated to engage at least some of the common through-holes 36 of the adhesion target S and the adhesive member A, which are determined as the aligning positions of the adhesion target S and the adhesive member A. That is, in the present variant example, aligning of the adhesion target S and the adhesive member A are performed by aligning the common through-holes 36 of the adhesion target S and the common through-holes 36 of the adhesive member A (that is, each of the common through-holes of the adhesion target S is connected with a corresponding one of the common through-holes of the adhesive member A).

The common through-holes 36 are formed with a diameter greater than the diameter of the second pins 31. The second holes 32 are preferably formed with a small deviation in a lateral direction, more preferably formed without a deviation in a lateral direction. For example, with respect to the diameter of the common through-holes 36, each of the second pins 31 has a diameter of preferably 200 μm or less, more preferably 100 μm or less, further preferably 50 μm or less. With the arrangement described above, aligning accuracy between the object to be adhered S and the adhesive member A can be improved, for example, positional deviation within 100 μm, more preferably within 50 μm can be achieved. For example, the diameter of the to the second pins 31 can be in a range of 1.0 to 5.0 mm. The diameter of the common through-holes 36 can be determined as (the diameter of the second pins 31) plus (200 μm or less).

With either of the aligning according to the present variant example or the embodiment described above, aligning of the adhesion target S and the adhesive member A can be appropriately achieved, and thus, can be appropriately selected. Further variant examples according to the present embodiment will be described below. In each example shown in FIG. 1 to FIG. 3, the first member 21 is provided with nine first holes 4 and nine first pins 5, but other appropriate number of the first holes 4 and the first pins can be employed. The first holes 4 may be formed at 2 to 8 locations or may be formed at 10 or more locations. The number of locations to form the first holes 4 can be appropriately adjusted according to the size of the area, the thickness, rigidity, the weight, etc., of the adhesive member A.

The higher degree of rigidity and the smaller degree of sagging, the smaller number of the first pins 5 are required. The degree of rigidity of the adhesive member A increases as the thickness of the adhesive member A increases, for example, when the adhesive member A is a bonding member and the bonding member and the releasable sheet are made of the same material. When the bonding member and the releasable sheet are made of different materials, the degree of rigidity of the adhesive member A increases as a higher Young's modulus.

The first member 21 includes the first holes 4 and the first pins 5 with a number density of, for example, preferably $18/m^2$ or greater, which allows the adhesive member A to be supported on the first pins 5. The greater the number density of the first holes 4 and the first pins 5 of the first member 21, the adhesive member A can be supported with the greater stability with the smaller degree of sagging. On the other hand, the greater the number density of the first holes 4 and the first pins 5 of the first member 21, the greater the number of the first through-holes S5h be required in the adhesion target S, which may hinder the predetermined function of the adhesion target S. Therefore, it is preferable to take those views into account when determining the maximum number density of the first holes 4 and the first pins 5 of the first member 21.

Further, in FIG. 1 to FIG. 3, the first holes 4 is formed in the first member 21 at nine locations, and the first adjusting member 6 and the first pin 5 affixed thereto is disposed in all the first holes 4, but other appropriate arrangement can also be employed. For example, two or more locations, preferably three or more locations can be appropriately selected from the nine locations of the first holes 4 and used as needed. That is, the number and locations of the first pins 5 and the first holes 4 etc., for use can be selected appropriately. Accordingly, for example, when the adhesion target S is a wiring substrate and a wiring is disposed at a location coincides with the first hole 4, the first pin 5 can be arranged appropriately avoiding the use of the first hole 4 at the location coincides with the wiring. For this reason, the adhering jig 1 can be provided with the first member 21 defining as many the number of the first holes 4 in which the first pins 5 are arranged, such that appropriate number and locations of the first pins 5 can be selected for use as needed. With this arrangement, the adhering jig 1 can be used by removing the first pins from the locations that are not required.

In such a case, alternatively, for example, the first pins 5 may be removably affixed on the first adjusting members 6. The locations of the first pins 5 are selected according to the locations of the first through-holes S5h of the adhesion target S, then the first pins 5 are placed through the first through-holes S5h of the adhesion target S, and then affixed onto corresponding first adjusting members 6. The first pins 5 can be affixed to the first adjusting members 6 by using an appropriate means such as a screw. Alternatively, for example, as shown in FIG. 3, the first pins 5 and the first adjusting members 6 are respectively affixed to each other to form single components, which are then disposed in the first housings 22a or removed from the first housings 22a as needed. Either of the arrangements described above will allow the selection and use of the first pins 5 at appropriate locations.

Further, the aligning parts 3 are configured to position the adhesion target S and the adhesive member A, and any appropriate component or the like can be employed other than the second pins 31. For example, markers printed on respective predetermined locations of the adhesion target S and the adhesive member A can be used as the aligning parts 3. Such markers are read visually or by camera etc., and adjust the positions of the adhesion target S and the adhesive member A accordingly so that the positions of the markers are within the predetermined range.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. An adhering jig, comprising:
    a mounting plate having an upper surface;
    a plurality of aligning parts incorporated in the mounting plate;
    a plurality of first holes formed in the upper surface of the mounting plate;
    a plurality of first pins engaged in the plurality of first holes, the plurality of first pins respectively having a base end and an upper end, configured to be movable in a direction normal to the upper surface of the mounting plate; and
    a plurality of first adjusting members located inward with respect to the upper surface of the mounting plate, the plurality of first adjusting members being configured to support the plurality of first pins and to adjust movements of the plurality of first pins;
    wherein the plurality of first adjusting members are, when the plurality of first pins are pressed in the first holes, configured to exert opposite force to the pressing force applied through the plurality of first pins,
    wherein the mounting plate comprises:
    a first member having the plurality of first holes; and
    a second member opposite to the first member and incorporating the plurality of first adjusting members opposite to the first member; and wherein
    the plurality of first holes and the plurality of first adjusting members are opposite to each other,
    wherein the second member supports the first member, and the first member covers the plurality of first adjusting members with the plurality of first pins penetrating through the plurality of first holes.

2. The adhering jig according to claim 1, wherein the opposite force exerted from the first adjusting members to the force applied through the plurality of first pins is in a range of 0.15 N and 180 kN.

3. The adhering jig according to claim 1, wherein
    the plurality of first adjusting members comprise plate springs or coil springs,
    the base ends of the plurality of first pins are affixed to the first adjusting members, and
    the plurality of first pins are moved downward in the plurality of first holes due to elastic deformation of the plurality of first adjusting members.

4. The adhering jig according to claim 1, wherein
    the mounting plate further includes a plurality of second holes,
    a plurality of second pins, respectively having a base end and an upper end, are engaged in the plurality of second holes, and
    the plurality of aligning parts comprise the plurality of second pins.

5. The adhering jig according to claim 4, further comprising a plurality of second adjusting members located inward with respect to the upper surface of the mounting plate, the plurality of second adjusting members being configured to support the plurality of second pins and to adjust movement of the plurality of second pins in a direction normal to the upper surface of the mounting plate;
    wherein the plurality of second pins are movable in a direction normal to the upper surface of the mounting plate; and
    the plurality of second adjusting members are, when the plurality of second pins are pressed in the second holes, configured to exert opposite force to the force applied through the plurality of second pins.

6. The adhering jig according to claim 5, wherein the plurality of second adjusting members comprise plate springs or coil springs;
the base ends of the plurality of second pins are affixed to a corresponding one of the plurality of second adjusting members; and
the plurality of second pins are configured to be moved downward in the plurality of second holes due to elastic deformation of the plurality of second adjusting members.

7. The adhering jig according to claim 5, wherein
the second holes are disposed in the first member,
the second member incorporates the plurality of second adjusting members, and wherein
the second holes and the second adjusting members are respectively opposite to each other.

8. The adhering jig according to claim 4, wherein surfaces of at least either of the first pins or the second pins are covered by a fluororesin.

9. The adhering jig according to claim 1, wherein each of the first pins are configured to have a length such that when the first adjusting members are elastically deformed, each of the upper ends of the first pins are lowered within the first holes.

10. The adhering jig according to claim 1, wherein
each of the first adjusting members is formed with a plate spring,
the plate spring comprises a flat portion in a center portion and support leg portions bent at a predetermined angle from each end of the flat portion,
a base end of each of the first pins is affixed to a center of the flat portion of each of the first adjusting members, and
each of the first adjusting members are configured to elastically deform in the perpendicular direction such that each of the first pins protruding out of each of the first holes are allowed to move perpendicularly downward to be accommodated within each of the first holes by elastic deformation of each of the first adjusting members.

11. The adhering jig according to claim 1, wherein
each of the first adjusting members is formed with a coil spring with a flange affixed to an upper portion of the coil spring,
the flange has a diameter greater than a diameter of each of the first holes, and
a base end of each of the first pins is affixed to the center of the flange, such that each of the first pins in a state of protruding from each of the first holes can be moved in a perpendicular direction to be accommodated in each of the first holes, due to elastic deformation of each of the first adjusting members.

12. A method of adhering an adhesive member to an adhesion target using the adhering jig according to claim 1, the method comprising:
mounting the adhesion target on the mounting plate, the mounting including engaging a plurality of first through-holes formed in the adhesion target with the plurality of first pins affixed on the plurality of first adjusting members that are, when the plurality of first pins are pressed in the first holes, configured to support the plurality of first pins through exerting a force opposite to the force applied through the plurality of first pins, and mounting the adhesion target on the mounting plate;
supporting the adhesive member on the plurality of first pins, spaced apart from the adhesion target, while abutting the adhesive member to the aligning parts; and
adhering the adhesive member and the adhesion target, the adhering including,
causing the plurality of first pins to move downward, normal to the upper surface of the mounting plate, such that at least a portion of the first pins are lowered in the first holes, while pressing the adhesive member against the adhesion target and to thereby adhere the adhesive member to the adhesion target.

13. The method according to claim 12, wherein in the step of adhering, the adhesive member and the adhesion target are adhered while pressing from a center portion toward a peripheral portion of the adhesive member.

14. The method according to claim 12, wherein the step of adhering is carried out under vacuum.

15. The method according to claim 12, wherein in the step of bonding, a fluid is applied to a film, wherein the film is configured to expand in a direction accommodating the first pins in the first holes of the mounting plate when the fluid is supplied, the fluid thereby causing the film to expand which then presses the adhesive member.

16. The method according to claim 12, wherein the first pins are removably affixed to the first adjusting members, the method further comprising
selecting the first pins in conformity to locations of the first through-holes formed in the adhesion target, and engaging the through-holes of the adhesion target with the first pins affixed to the first adjusting members.

17. The method according to claim 12, wherein the mounting plate includes a plurality of second holes and a plurality of second pins located in the plurality of second holes,
the second pins serve as the aligning parts,
the adhesion target includes a plurality of second through-holes, and wherein
the plurality of second pins are disposed at locations allowing the plurality of second pins to engage at least some of the second through-holes of the adhesion target, and are disposed at locations determining aligning locations of the adhesive member where lateral ends of the adhesive member abut the second pins.

18. The method according to claim 12, wherein the mounting plate further defines a plurality of second holes and a plurality of second pins affixed in the plurality of second holes,
the second pins serve as the aligning parts, and
the plurality of second pins are disposed at locations determining aligning location of the adhesion target and the adhesive member where lateral ends of the adhesion target and the adhesive member are in contact with the second pins.

19. The method according to claim 12, wherein the adhesion target comprises a wiring substrate.

20. The method according to claim 19, wherein the wiring substrate comprises a flexible wiring substrate.

21. The method according to claim 12, wherein the adhesive member has an adhesive layer on a surface facing the adhesion target.

22. The method according to claim 12, wherein each of the first pins are configured to have a length such that when the first adjusting members are elastically deformed, each of the upper ends of the first pins are lowered within each of the first holes.

23. The method according to claim 12, wherein
each of the first adjusting members is formed with a plate spring,
the plate spring comprises a flat portion in a center portion and support leg portions bent at a predetermined angle from each end of the flat portion,
a base end of each of the first pins is affixed to a center of the flat portion of each of the first adjusting members, and
each of the first adjusting members are configured to elastically deform in the perpendicular direction such that each of the first pins protruding out of each of the first holes are allowed to move perpendicularly downward to be accommodated within each of the first holes by elastic deformation of each of the first adjusting members.

24. The method according to claim 12, wherein
each of the first adjusting members is formed with a coil spring with a flange affixed to an upper portion of the coil spring,
the flange has a diameter greater than a diameter of each of the first holes, and
a base end of each of the first pins is affixed to the center of the flange, such that each of the first pins in a state of protruding from each of the first holes can be moved in a perpendicular direction to be accommodated in each of the first holes, due to elastic deformation of each of the first adjusting members.

\* \* \* \* \*